(12) United States Patent
Katsunuma et al.

(10) Patent No.: US 9,318,340 B2
(45) Date of Patent: Apr. 19, 2016

(54) METHOD OF MANUFACTURING A SEMICONDUCTOR DEVICE

(71) Applicant: TOKYO ELECTRON LIMITED, Tokyo (JP)

(72) Inventors: Takayuki Katsunuma, Miyagi (JP); Masanobu Honda, Miyagi (JP); Kazuhiro Kubota, Miyagi (JP); Hironobu Ichikawa, Yamanashi (JP)

(73) Assignee: TOKYO ELECTRON LIMITED, Tokyo (JP)

( * ) Notice: Subject to any disclaimer, the term of this patent is extended or adjusted under 35 U.S.C. 154(b) by 0 days.

(21) Appl. No.: 14/353,451

(22) PCT Filed: Oct. 25, 2012

(86) PCT No.: PCT/JP2012/006850
§ 371 (c)(1),
(2) Date: Apr. 22, 2014

(87) PCT Pub. No.: WO2013/061593
PCT Pub. Date: May 2, 2013

(65) Prior Publication Data
US 2014/0273486 A1    Sep. 18, 2014

Related U.S. Application Data

(60) Provisional application No. 61/557,458, filed on Nov. 9, 2011.

(30) Foreign Application Priority Data

Oct. 28, 2011   (JP) .................................. 2011-236694

(51) Int. Cl.
H01L 21/3065   (2006.01)
H01J 37/32   (2006.01)
H01L 21/311   (2006.01)
H01L 21/768   (2006.01)

(52) U.S. Cl.
CPC ....... *H01L 21/3065* (2013.01); *H01J 37/32082* (2013.01); *H01J 37/32642* (2013.01); *H01L21/31116* (2013.01); *H01L 21/31122* (2013.01); *H01L 21/31144* (2013.01); *H01L 21/76811* (2013.01); *H01L 21/76813* (2013.01)

(58) Field of Classification Search
CPC ..................... H01L 21/31116; H01L 21/3065; H01J 37/32082
USPC .......................................................... 438/710
See application file for complete search history.

(56) References Cited

U.S. PATENT DOCUMENTS

| | | |
|---|---|---|
| 2006/0213864 A1 | 9/2006 | Tahara et al. |
| 2007/0181181 A1 | 8/2007 | Mizusawa |
| 2008/0233757 A1* | 9/2008 | Honda et al. .................. 438/711 |
| 2009/0117746 A1* | 5/2009 | Masuda ....................... 438/710 |
| 2009/0218317 A1* | 9/2009 | Belen et al. ..................... 216/67 |

FOREIGN PATENT DOCUMENTS

| | | |
|---|---|---|
| JP | 2006-269879 A | 10/2006 |
| JP | 2007-214295 A | 8/2007 |
| JP | 4701776 B2 | 6/2011 |
| JP | 2011-192664 A | 9/2011 |

OTHER PUBLICATIONS

International Search Report mailed Jan. 22, 2013 in PCT/JP2012/006850.

* cited by examiner

*Primary Examiner* — Duy Deo
*Assistant Examiner* — Mahmoud Dahimene
(74) *Attorney, Agent, or Firm* — Rothwell, Figg, Ernst & Manbeck, P.C.

(57) ABSTRACT

A method of manufacturing a semiconductor device including a wafer using a plasma etching device which includes a chamber, a chuck provided in the chamber to dispose a wafer to be processed thereon, a focus ring disposed at a peripheral edge portion of the chuck, and a gas supplying mechanism configured to supply various types of gases depending a radial position of the wafer. The method includes: placing a wafer formed with an organic film on the chuck; introducing an etching gas which etches the organic film on the wafer from the process gas supplying mechanism to a central portion of the wafer; introducing an etching inhibiting factor gas having a property of reacting with the etching gas to the peripheral edge portion of the wafer from the gas supplying mechanism; and performing plasma etching on the wafer using the etching gas.

5 Claims, 12 Drawing Sheets

SOH condition: 10mT, 400+500W, DC=0V, O2/Ar=50/200sccm, 58sec., (Ignition: 30mT, 2sec.)
Common: RDC=50, B.He(C/E)=30/40Torr, T/W/B=150/150/20deg.C

| List of Gas Flow Rate of Each Portion | Center (a) | Middle (b) | Edge (c) | Very Edge (d) |
|---|---|---|---|---|
| Base-$O_2$/Ar[sccm] | 2.2/9.0 | 8.2/33 | 14.8/59 | 25/99 |

| List of Gas Flow Rate of Each Portion | Center (a) | Middle (b) | Edge (c) | Very Edge (d) |
|---|---|---|---|---|
| Current Base-$O_2$/Ar | *4.3*/9.0 | *16.3*/33 | *29.3*/59 | *0/297* |

SOH condition: 10mT, 400+500W, DC=0V, O2/Ar=50/200sccm, 58sec., (Ignition: 30mT, 2sec.)
Common: RDC=50, B.He(C/E)=30/40Torr, T/W/B=150/150/20deg.C

FIG.3A
| Gas Species of Each Portion | Center (a) | Middle (b) | Edge (c) | Very Edge (d) |
|---|---|---|---|---|
| Base | $O_2$/Ar | $O_2$/Ar | $O_2$/Ar | $O_2$/Ar |
| $C_4F_6$ added | $O_2$/Ar | $O_2$/Ar | $O_2$/Ar | $C_4F_6$ |
FIG.3B
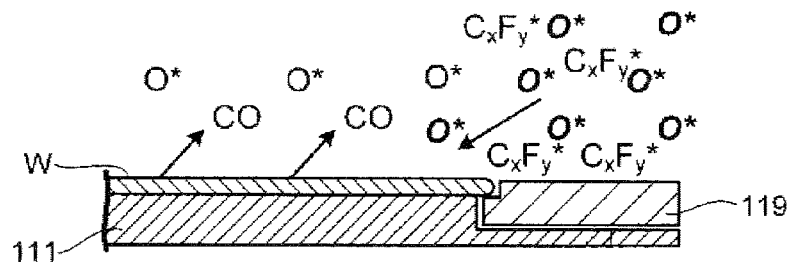
FIG.3C
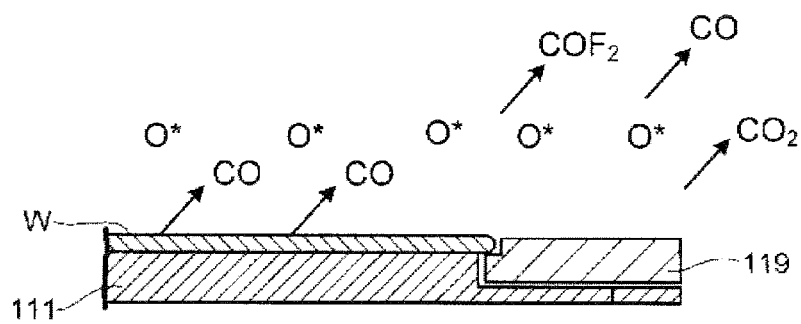

METHOD OF MANUFACTURING A SEMICONDUCTOR DEVICE

CROSS REFERENCE TO RELATED APPLICATION

This application is a 35 U.S.C. 371 National Phase Entry Application from PCT/JP2012/006850, filed Oct. 25, 2012, which claims the benefit of U.S. Provisional Application No. 61/557,458, filed Nov. 9, 2011 and Japanese Patent Application No. 2011-236694, filed Oct. 28, 2011, the disclosures of which are incorporated herein in their entirety by reference.

TECHNICAL FIELD

The present disclosure relates to a method of manufacturing a semiconductor device including a plasma etching process on a substrate.

BACKGROUND

As an apparatus for processing a substrate such as a semiconductor wafer (hereinafter, referred to as a "wafer") in a manufacturing process of a semiconductor device, there is a plasma etching device which etches a wafer by irradiating plasma onto the wafer.

In a plasma etching process, an etching gas including fluorine, chlorine, and oxygen is activated by a radio frequency electric field to generate plasma. The plasma includes active species such as charged particles (hereinafter, referred to as "ions") and neutral particles (hereinafter, referred to as "radicals"). The active species such as ions or radials react with a wafer surface to generate a reaction product and the generated reaction product is volatilized so that the etching process is performed.

Recently, in the manufacturing process of a semiconductor device, since a diameter of a wafer is increased, it becomes difficult to uniformize an etching speed in a wafer plane. Therefore, in order to improve in-plane uniformity, it has been attempted to uniformize a density of the active species in a center area and a peripheral area in the wafer plane by adjusting the amount of an etching gas supplied from an upper electrode (See, e.g., Patent Document 1).

PRIOR ART DOCUMENT

Patent Document

Patent Document 1: Japanese Patent No. 4701776

SUMMARY OF DISCLOSURE

Technical Problems to be Solved

However, in the manufacturing process of a semiconductor device of the related art, when an under-layer organic resist film (e.g., amorphous carbon) is etched with plasma using an intermediate layer including an inorganic material and an upper layer photosensitive resist film which are formed thereon, as a mask, a mixture gas of $O_2$ gas and $CH_4$ gas is used as a processing gas. In this case, it is known that side etching easily occurs in a side wall so that a bowing phenomenon occurs. Specifically, there is a problem in that a difference in etched shape is caused at a central portion and a peripheral edge portion in a single semiconductor wafer.

The present disclosure has been made in an effort to provide a method of manufacturing a semiconductor device which may uniformize the etched shape at a central portion and a peripheral edge portion of a wafer.

Means to Solve the Problems

In order to solve the problems, an exemplary embodiment of the present disclosure provides a method of manufacturing a semiconductor device including a wafer using a plasma etching device which includes a chamber, a chuck provided in the chamber so as to dispose a wafer to be processed thereon, a focus ring disposed at a peripheral edge portion of the chuck to surround the disposed position of the wafer, and a gas supplying mechanism configured to supply various types of gases according to a position in a radial direction of the wafer. The method includes: placing a wafer formed with an organic film on the chuck; introducing an etching gas which etches the organic film on the wafer from the gas supplying mechanism to a central portion of the wafer; introducing an etching inhibiting factor gas having a property of reacting with the etching gas to the peripheral edge portion of the wafer from the gas supplying mechanism; and performing plasma etching on the wafer using the etching gas.

Advantageous Effect of Disclosure

A method of manufacturing a semiconductor device which may uniformize etched shape at a central portion and a peripheral edge portion of a wafer may be provided.

BRIEF DESCRIPTION OF DRAWINGS

FIG. 3A is a view illustrating an example in which a processing gas of the peripheral edge portion of the wafer is changed.

FIG. 3B is a view illustrating a function of a processing gas at the peripheral edge portion of the wafer.

FIG. 3C is a view illustrating a function of a processing gas at the peripheral edge portion of the wafer.

DETAILED DESCRIPTION TO EXECUTE THE INVENTION (Wafer In-Plane Deviation of E/R)

In plasma etching which etches an organic film, it is known that an etching rate is higher at a peripheral edge portion of a wafer than at a central portion thereof. This is considered because O radical on a focus ring contributes to etching of the peripheral edge portion of the wafer and a difference of materials of the wafer and the focus ring contributes to the difference in etching rate. Ununiformity of an etching rate in a wafer plane may cause a bowing or an undercut phenomenon which occurs at a side wall of an organic film which exist in a lowest layer of a multilayered resist mask.

Figure 1A:
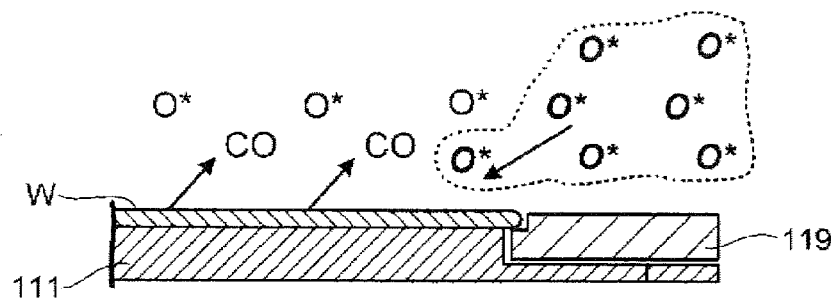
FIG. 1A is a view illustrating a plasma etching state at a peripheral edge portion of a wafer.
Figure 1B:
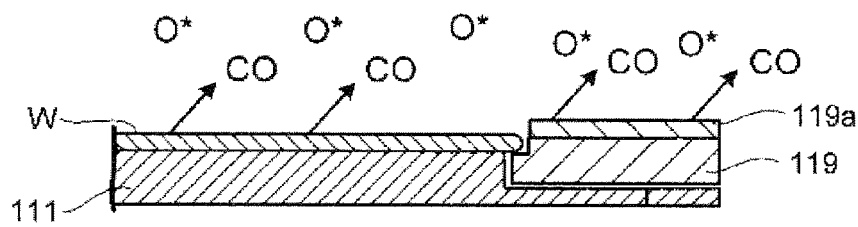
FIG. 1B is a view illustrating a plasma etching state at a peripheral edge portion of a wafer.

FIGS. 1A and 1B illustrate a plasma etching state at a peripheral edge portion of a wafer. As illustrated in FIG. 1A, it is assumed that a wafer W disposed on an electrostatic chuck 111 is subjected to plasma etching. A focus ring 119 is formed of a dielectric material such as a ceramics or quartz or a conductive material such as monocrystalline silicon. However, when an organic film is formed on the wafer W, a reaction mechanism may vary on the organic film and the focus ring. For example, even when, on the organic film of the wafer W, O radicals react with the organic film to be turned into CO and separated, the O radicals on the focus ring 119 are not consumed by the reaction. Therefore, the O radicals on the focus ring 119 are surplus to contribute to etching of the peripheral edge portion of the wafer W. That is, the etching rate at the peripheral edge portion of the wafer is increased.

Figure 1C:
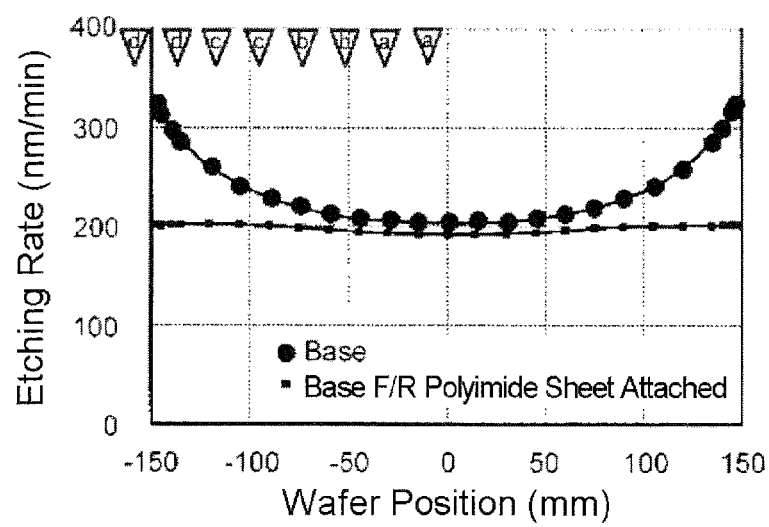
FIG. 1C is a view illustrating in-plane uniformity of an etching rate in plasma etching.

Here, as illustrated in FIG. 1B, a change of the etching rate when a polyimide sheet film is adhered on the focus ring 119 to have reactivity with the O radicals was researched. FIG. 1C illustrates comparison results of etching rates in the case when the polyimide sheet film was adhered on the focus ring 119 and in the case when the polyimide sheet film was not adhered thereon (Base). As illustrated in FIG. 1C, when the focus ring was exposed, the etching rate at the peripheral edge portion of the wafer was suddenly increased. Meanwhile, when the polyimide sheet film was adhered on the focus ring 119 to have reactivity with the O radicals, the etching rate was substantially uniform from the center to the peripheral edge portion of the wafer. Therefore, it can be appreciated that when surplus O radicals are suppressed on the focus ring, an in-plane etching rate of a wafer plane formed with an organic film may be uniformized.

(Improvement of E/R at Wafer Edge Area)

In the organic film etching, a shape control may be enabled when oxygen gas or rare gas is added to a processing gas. Further, it is known that, when a concentration of an inert gas is increased, an etching state at the side wall is desirable. Therefore, a method of suppressing a flow rate of $O_2$ gas at the peripheral edge portion of the wafer and increasing a flow rate of $O_2$ gas at the central portion of the wafer is considered.

Figures 2A, 2B, 2C:
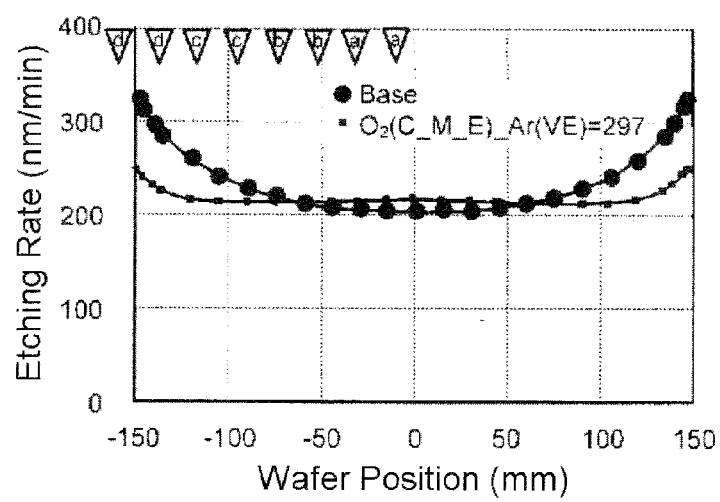
FIG. 2A is a view illustrating a flow rate example of a processing gas in plasma etching of the related art.
FIG. 2B is a view illustrating an example in which a flow rate ratio at a central portion and a peripheral edge portion of a wafer is changed in the plasma etching illustrated in FIG. 2A.
FIG. 2C is a view illustrating in-plane uniformity of an etching rate in the plasma etching using the flow rate illustrated in FIGS. 2A and 2B.

FIG. 2A illustrates an example of a flow rate of a processing gas in plasma etching of the related art and FIG. 2B illustrates an example in which a flow rate of the processing gas varies at the central portion and the peripheral edge portion of the wafer in the plasma etching illustrated in FIG. 2A. As compared with the flow rate of the processing gas of the related art illustrated in FIG. 2A, in the example illustrated in FIG. 2B, the $O_2$ gas flow rate is increased at the central portion (Center), a middle area (Middle), and an edge portion (Edge) of the wafer and the $O_2$ gas flow rate is set to be zero at the peripheral edge portion (Very Edge) of the wafer.

FIG. 2C illustrates wafer in-plane etching rates of the plasma etching according to conditions of FIGS. 2A and 2B. As illustrated in FIG. 2C, it can be appreciated that the sudden increase of the etching rate in the vicinity of the peripheral edge portion of the wafer is not still completely resolved only by controlling the $O_2$ gas flow rate. As described above, it can be appreciated that there is a limitation in controlling an amount of the O radicals generated at the peripheral edge portion of the wafer and outside of the peripheral edge portion only by controlling a wafer in-plane distribution of a supplied amount of a processing gas.

(Use of Scavenger Effect)

In the plasma etching according to the exemplary embodiment, a processing gas having an effect (scavenger effect) of removing surplus O radicals at the peripheral edge portion of the wafer is supplied to the peripheral edge portion of the wafer. That is, a gas such as, for example, $CH_3F$ or $C_4F_6$ is introduced to the peripheral edge portion of the wafer. For example, as illustrated in FIG. 3A, $C_4F_6$ gas is supplied to the wafer at the peripheral edge portion of the wafer, instead of $O_2$ gas.

As illustrated in FIGS. 3B and 3C, a gas having the scavenger effect (etching inhibiting factor gas) reacts with the surplus O radicals on the focus ring 119. For example, as illustrated in FIG. 3B, when $C_xF_y$ gas is introduced to the peripheral edge portion of the wafer W, an unsaturated species selectively reacts with the O radicals. Thus, a reaction as indicated in Equation (1) is exhibited.

$$(O,O_2)+C_xF_y \rightarrow (COF_2,CO,CO_2)+(F,F_2) \qquad (1)$$

That is, the surplus O radicals may be removed.

As described above, in the plasma etching according to the exemplary embodiment, the etching inhibiting factor gas is introduced to the peripheral edge portion of the wafer to remove the surplus O radicals. Therefore, in a plasma etching device which implements the plasma etching according to the exemplary embodiment (and a manufacturing device which implements a method of manufacturing a semiconductor device including the plasma etching), it is required not only to control a flow rate of an introduced gas in a radial direction of the wafer but also to select and control a gas species introduced in the radial direction of the wafer.

(Configuration of Manufacturing Device according to Exemplary Embodiment)

An example of a plasma etching device which is suitable for a semiconductor device manufacturing method according to an exemplary embodiment will be described with reference to FIG. 4.

Figure 4:
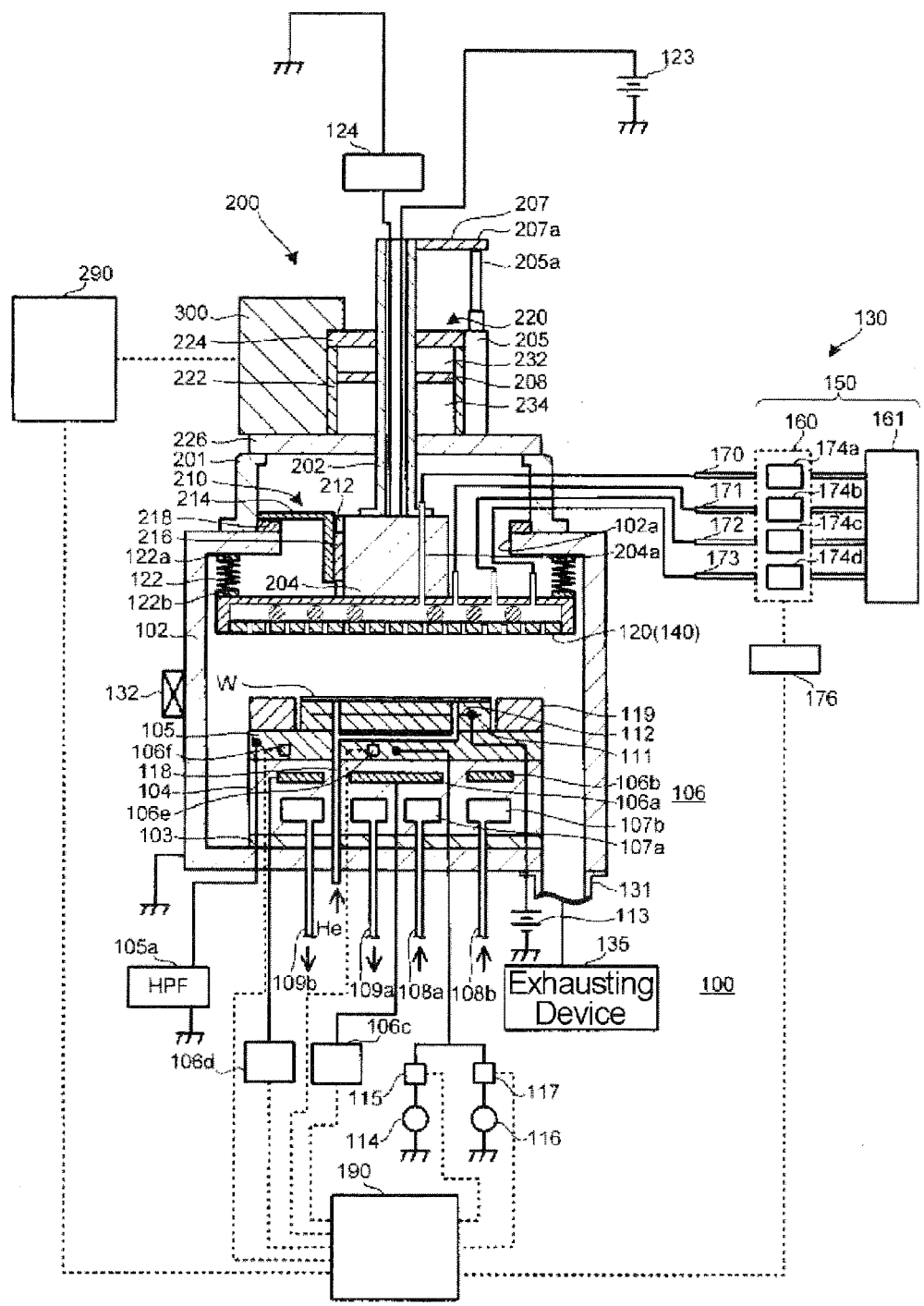
FIG. 4 is a view illustrating a configuration of a plasma etching device according to an exemplary embodiment.

As illustrated in FIG. 4, a plasma etching device 100 includes a chamber (processing container) 102 formed in a cylindrical shape having a surface which is formed of, for example, treated by aluminum anodic oxidization (alumite process). The chamber 102 is grounded. A susceptor support 104 having a substantially cylindrical shape is installed on the bottom of the chamber 102 through an insulating plate 103 such as a ceramic. A susceptor 105 which configures a lower electrode is installed on the susceptor support 104. The susceptor 105 is grounded via a high pass filter (HPF) 105a.

The susceptor 105 is formed in a disk shape whose top side central portion is concave. The electrostatic chuck 111 having a diameter which is substantially the same as the diameter of the wafer W which is an example of an object to be processed is provided on the susceptor 105. The electrostatic chuck 111 includes insulating materials which are formed of disk-shaped ceramic members and an electrostatic electrode 112 interposed between the insulating materials. Further, a DC power source 113 is connected to the electrostatic electrode 112 of the electrostatic chuck 111. For example, when a DC voltage of 1.5 kV is applied to the electrostatic electrode 112 from the DC power source 113, the wafer W is attracted to and held on the electrostatic chuck 111.

A first radio frequency power source 114 is connected to the susceptor 105 through a first matching unit 115 and a second radio frequency power source 116 is connected to the susceptor 105 through a second matching unit 117. The first radio frequency power source 114 applies a bias power having a first frequency, for example, a frequency of 13.6 MHz, to the susceptor 105. The second radio frequency power source 116 applies a plasma generating power having a second frequency, for example, a frequency of 40 MHz, to the susceptor 105. Plasma is generated in the chamber 102 by the plasma generating power.

A gas passage 118 is formed in the insulating plate 103, the susceptor support 104, the susceptor 105, and the electrostatic chuck 111 so as to supply a heat transferring medium (e.g., a backside gas such as He gas) onto a rear surface of the wafer W. Heat transfer is performed between the susceptor 105 and the wafer W through the heat transferring medium and the wafer W is maintained at a predetermined temperature.

A ring shaped focus ring 119 (F/R) is disposed at an peripheral edge portion of the top side of the susceptor 105 so as to surround the wafer W supported on the electrostatic chuck 111. The focus ring 119 is formed of a dielectric material such as ceramics or quartz or a conductor, for example, a conductive material such as the monocrystalline silicon which is the same as the material which configures the wafer W.

When a distribution region of the plasma extends to the top of the focus ring 119, the density of the plasma outside of the peripheral edge portion of the wafer W may be maintained at a level that is substantially equal to a density of the plasma at the central portion of the wafer W. Therefore, the uniformity of the plasma etching in the plane of the wafer W may be improved.

An upper electrode 120 is provided above the susceptor 105 to face the susceptor 105 in parallel. The upper electrode 120 also functions as a shower head 140 (described below) which supplies an etching gas toward the wafer W supported by the susceptor 105. The DC power source 123 is connected to the upper electrode 120. Further, the upper electrode 120 is grounded via a low pass filter (LPF) 124.

The upper electrode 120 is configured to be driven in a vertical direction by an upper electrode driving unit 200. The upper electrode 120 is configured to be driven in the vertical direction so that a distance (hereinafter, referred to as a "gap") G of a space between the upper electrode 120 and the susceptor 105 may be adjusted. Since the gap G is a parameter which significantly affects the diffusion and flow of the etching gas, the plasma distribution between the upper electrode 120 and the susceptor 105 in the chamber 102 may be controlled when the gap G is configured to be adjustable.

A movement amount of the upper electrode 120, which is driven by the upper electrode driving unit 200, in the vertical direction is not particularly limited. For example, it is possible to adopt a structure in which the movement amount of the upper electrode 120 in the vertical direction is 70 mm and the gap G is adjusted to be equal to or larger than 20 mm and equal to or smaller than 90 nm. Further, the plasma etching device 100 may have a configuration obtained by rotating the configuration illustrated in FIG. 4 by 90° and horizontally tilting the configuration, or a configuration obtained by turning the configuration upside down.

The upper electrode 120 may be supported on a top inner wall of the chamber 102 by a bellows 122. The bellows 122 is attached to the top inner wall of the chamber 102 through an annular upper flange 122a by fixing means such as bolts and attached to the top surface of the upper electrode 120 through an annular lower flange 122b by the fixing means such as bolts.

A configuration of the upper electrode driving unit 200 which may adjust the gap G will be described in detail. The upper electrode driving unit 200 includes a substantially cylindrical support member 204 which supports the upper electrode 120. The support member 204 is attached at a substantially center of the top of the upper electrode 120 by, for example, bolts. The support member 204 is disposed to be capable of going in and out of a hole 102a which is formed at a substantially center of the top wall of the chamber 102. Specifically, an outer peripheral surface of the support member 204 is supported inside the hole 102a of the chamber 102 through a sliding mechanism 210. The sliding mechanism 210 includes a guide member 216 which is fixed through the fixing member 214 having a L-shaped cross-section to the vertical portion of the fixing member 214, for example, in the upper portion of the chamber, and a rail unit 212 which is slidably supported by the guide member 216 and formed in one direction (a vertical direction in this exemplary embodiment) on the outer peripheral surface of the support member 204.

The horizontal portion of the fixing member 214 which fixes the guide member 216 of the sliding mechanism 210 is fixed to the upper portion of the chamber 102 through an annular horizontal adjusting plate 218. The horizontal position of the upper electrode 120 is adjusted by the horizontal adjusting plate 218. The horizontal adjusting plate 218 is fixed to the chamber 102 by a plurality of bolts which are disposed in a circumferential direction of the horizontal adjusting plate 218 at regular intervals. Further, the inclination amount of the horizontal adjusting plate 218 with respect to the horizontal direction may be adjusted by the protruding amount of the bolts. The inclination with respect to the horizontal direction is adjusted by the horizontal adjusting plate 218 and the inclination with respect to the vertical direction is adjusted by the guide member 216 of the sliding mechanism 210 so that the inclination of the upper electrode 120 in the horizontal direction may be adjusted. That is, the upper electrode 120 may be always maintained in the horizontal position.

At the top side of the chamber 102, a pneumatic cylinder 220 is attached the chamber 102 through a cylindrical body 201 in which the pneumatic cylinder 220 is configured to drive the upper electrode 120. That is, the lower end of the cylindrical body 201 is air-tightly attached by bolts to cover the hole 102a of the chamber 102 and the upper end of the cylindrical body 201 is air-tightly attached to the lower end of the pneumatic cylinder 220.

The pneumatic cylinder 220 has a rod 202 which may be driven in one direction. The lower end of the rod 202 is connected to a substantially center of the top surface of the support member 204 by, for example, bolts. When the rod 202 is driven, the upper electrode 120 may be moved by the support member 204 along the sliding mechanism 210. The rod 202 is configured in a cylindrical shape and an inner space of the rod 202 communicates with a central hole which is formed at a substantially center of the support member 204 and opened to the atmosphere. Accordingly, a wiring grounded via the upper electrode 120 and the low pass filter (LPF) 124 and a feeder line configured to apply a DC voltage from the DC power source 123 to the upper electrode 120 may be wired to be connected to the upper electrode 120 through the central hole of the support member 204 from the inner space of the rod 202.

A position detecting unit configured to detect the position of the upper electrode 120 such as, for example, a linear encoder 205, is provided on a side portion of the pneumatic cylinder 220. In the meantime, an upper end member 207 having an extending portion 207a which extends laterally from the rod 202 is provided at the upper end of the rod 202. The extending portion 207a of the upper end member 207 and a detecting unit 205a of the linear encoder 205 are abutted to each other. The upper end member 207 moves in response to the movement of the upper electrode 120 so that the position of the upper electrode 120 may be detected by the linear encoder 205.

The pneumatic cylinder 220 includes a cylindrical cylinder body 222, an upper support plate 224, and a lower support plate 226. The cylindrical cylinder body 222 is configured to be sandwiched between the upper support plate 224 and the lower support plate 226. An annular partitioning member 208 configured to partition the pneumatic cylinder 220 into an upper space 232 and a lower space 234 is provided on the outer peripheral surface of the rod 202.

The upper space 232 of the pneumatic cylinder 220 is configured such that compressed air is introduced from an upper port (not illustrated) of the upper support plate 224 into the upper space 232 of the pneumatic cylinder 220. Further, the lower space 234 of the pneumatic cylinder 220 is configured such that compressed air is introduced from a lower port (not illustrated) of the lower support plate 226 into the lower space 234 of the pneumatic cylinder 220. When the amount of air introduced from the upper port and the lower port into the upper space 232 and the lower space 234 is controlled, the rod may be controlled to be driven in one direction (for example, in the vertical direction). The amount of air introduced into the pneumatic cylinder 220 is controlled by a pneumatic circuit 300 which is provided in the vicinity of the pneumatic cylinder 220.

The upper electrode driving unit 200 includes a controller 290 which is connected to a device controller 190. A control signal from the device controller 190 is transmitted to the controller 290 and each component of the upper electrode driving unit 200 is controlled to be driven by the controller 290.

A temperature distribution adjusting unit 106 is disposed inside the susceptor support 104 in which the temperature distribution adjusting unit 106 is configured to adjust the in-plane temperature distribution of the wafer W. The temperature distribution adjusting unit 106 includes heaters 106a and 106b, power sources 106c and 106d for heaters, thermometers 106e and 106f, and refrigerant flow channels 107a and 107b.

A center side heater 106a and an outer periphery side heater 106b are disposed inside the susceptor support 104 from the center toward the outer periphery side. The power source 106c for the center side heater is connected to the center side heater 106a and the power source 106d for the outer periphery side heater is connected to the outer periphery side heater 106b. The power source 106c for the center side heater and the power source 106d for the outer periphery side heater may independently adjust the power supplied to the center side heater 106a and the power supplied to the outer periphery side heater 106b, respectively. Therefore, the temperature distribution along the radial direction of the wafer W may be formed on the susceptor support 104 and the susceptor 105. That is, the temperature distribution along the radial direction of the wafer W may be adjusted.

A center side thermometer 106e and an outer periphery side thermometer 106f are disposed inside the susceptor support 104 from the center side to the outer periphery side. The center side thermometer 106e and the outer periphery side thermometer 106f measure the temperatures of the central portion and the outer peripheral edge portion of the susceptor support 104, respectively, so that the temperatures of the center side and the outer periphery side of the wafer W can be derived. The temperatures measured by the center side thermometer 106e and the outer periphery side thermometer 106f are transmitted to the device controller 190. The device controller 190 adjusts outputs of the power source 106c for the center side heater and the power source 106d for the outer periphery side heater so that the temperatures of the wafer W derived from the measured temperatures become a target temperatures.

A center side refrigerant flow channel 107a and an outer periphery side refrigerant flow channel 107b may be provided inside the susceptor support 104 from the center side toward the outer periphery side. In addition, for example, cooling waters or fluorocarbon based refrigerants of different temperatures may be circulated in the flow channels 107a, 107b, respectively. When the refrigerant is circulated, the refrigerant is introduced into the center side refrigerant flow channel 107a through a center side introduction pipe 108a and discharged from a center side discharging pipe 109a. In the meantime, the refrigerant is introduced into the outer periphery side refrigerant flow channel 107b through an outer periphery side introduction pipe 108b and discharged from an outer periphery side discharging pipe 109b.

The temperature of the susceptor 105 is adjusted by heating by the heaters 106a and 106b and cooling from the refrigerant. Therefore, the wafer W is adjusted to have a predetermined temperature determined by a heated part by radiation from the plasma or irradiation of ions included in the plasma and the exchange of calories with the susceptor 105. Further, the susceptor support 104 includes the center side heater 106a (and the center side refrigerant flow channel 107a) and the outer periphery side heater 106b (and the outer periphery side refrigerant flow channel 107b). Therefore, the temperatures of the wafer W may be independently adjusted at the center side and the outer periphery side.

An insulator or a space may be provided between the center side heater 106a and the outer periphery side heater 106b or between the center side refrigerant flow channel 107a and the outer periphery side refrigerant flow channel 107b as an insulating layer. When the insulating layer is provided, the center side heater 106a and the outer periphery side heater 106b, or the center side refrigerant flow channel 107a and the outer periphery side refrigerant flow channel 107b may be thermally blocked from each other. That is, a larger temperature distribution may occur between the center side and the outer periphery side of the wafer W.

An exhaust pipe 131 is connected to the bottom of the chamber 102 and an exhausting device 135 is connected to the exhaust pipe 131. The exhausting device 135 includes a vacuum pump such as a turbo molecular pump and adjusts the inside of the chamber 102 to a predetermined decompressed atmosphere (for example, 0.67 Pa or lower). Further, a gate valve 132 is provided on the side wall of the chamber 102. When the gate valve 132 is opened, a wafer W may be carried into the chamber 102 or carried out of the chamber 102. A conveying arm is used for conveying the wafer W.

Figure 5A:
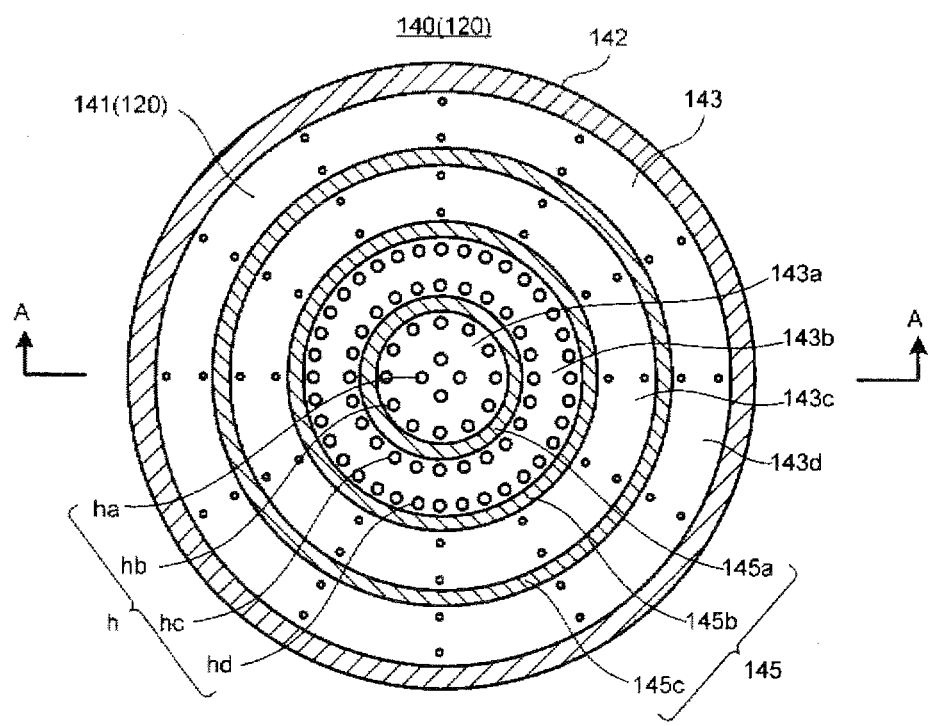
FIG. 5A is a view illustrating a configuration of a shower head in the plasma etching device according to the exemplary embodiment.

Subsequently, the shower head 140 will be described with reference to FIGS. 5A and 5B. As illustrated in FIG. 5A, the shower head 140 includes a circular electrode plate 141 (upper electrode 120) having a plurality of gas jetting holes h (ha to hd) so as to supply gas such as an etching gas to the wafer W, and an electrode support 142 configured to detachably support the top surface side of the electrode plate 141. The electrode support 142 has a disk shape having an outer diameter which is the same as the outer diameter of the electrode plate 141 and a circular buffer chamber 143 is formed inside the electrode support 142.

In the buffer chamber 143, one or more annular partitioning members 145 which are formed of, for examples, O rings are disposed on the electrode plate 141, as illustrated in FIG. 5A. Specifically, according to the present exemplary embodiment, three ring shaped partitioning members 145a, 145b, and 145c having different diameters are concentrically disposed. Therefore, the buffer chamber 143 is divided into a central area 143a (Center), a middle area 143b (Middle), a peripheral edge area 143c (Edge), and an outermost peripheral edge area 143d (Very Edge) along the radial direction of the electrode plate 141.

Figure 5B:
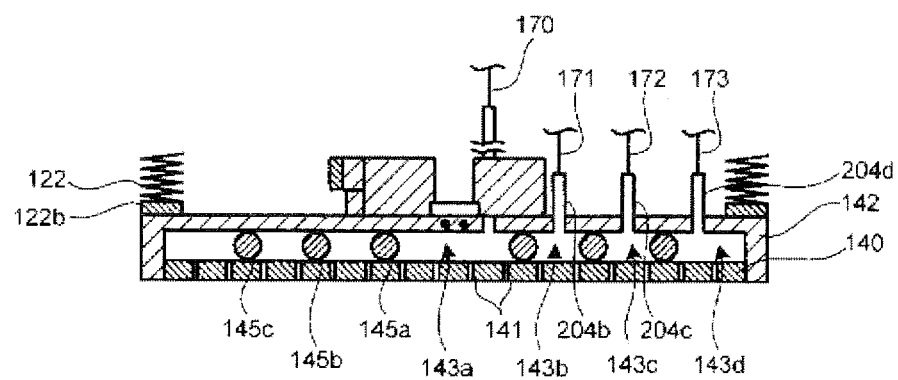
FIG. 5B is a view illustrating the configuration of the shower head in the plasma etching device according to the exemplary embodiment.

As illustrated in FIGS. 4 and 5B, the areas 143a to 143d are connected to a gas supplying device 150 such that the etching gas is supplied to the areas 143a to 143d from the gas supplying device 150. The etching gas supplied to the areas 143a to 143d is jetted toward the wafer W supported by the susceptor 105 from the corresponding gas jetting holes h.

The number and arrangement of gas jetting holes h may be determined such that the etching gas may be uniformly jet onto the wafer W. For example, the gas jetting holes h may be disposed on circumferences of a plurality of concentric circles which is concentrically disposed with respect to the center of the shower head 140 (the electrode plate 141). Specifically, when a wafer W having a diameter of 300 mm is used, in the central area 143a, four (4) gas jetting holes ha are disposed (e.g., at regular intervals) on the circumference of a circle having a radius of 11 mm and twelve (12) gas jetting holes hb are disposed (e.g., at regular intervals) on the circumference of a circle having a radius of 33 mm. In the middle area (143b), twenty four (24) gas jetting holes hc are disposed (e.g., at regular intervals) on a circumference of a circle having a radius of 55 mm and thirty six (36) gas jetting holes hd are disposed (e.g., at regular intervals) on a circumference of a circle having a radius of 77 mm. Although not illustrated, in the peripheral edge area 143c, forty eight (48) gas jetting holes are disposed (e.g., at regular intervals) on a circumference of a circle having a radius of 99 mm and sixty (60) gas jetting holes are disposed (e.g., at regular intervals) on a circumference of a circle having a radius of 121 mm. Although not illustrated, in the outermost peripheral edge area 143d, eighty (80) gas jetting holes are disposed (e.g., at regular intervals) on a circumference of a circle having a radius of 143 mm and one hundred (100) gas jetting holes are disposed (e.g., at regular intervals) on a circumference of a circle having a radius of 165 mm.

Figure 6:
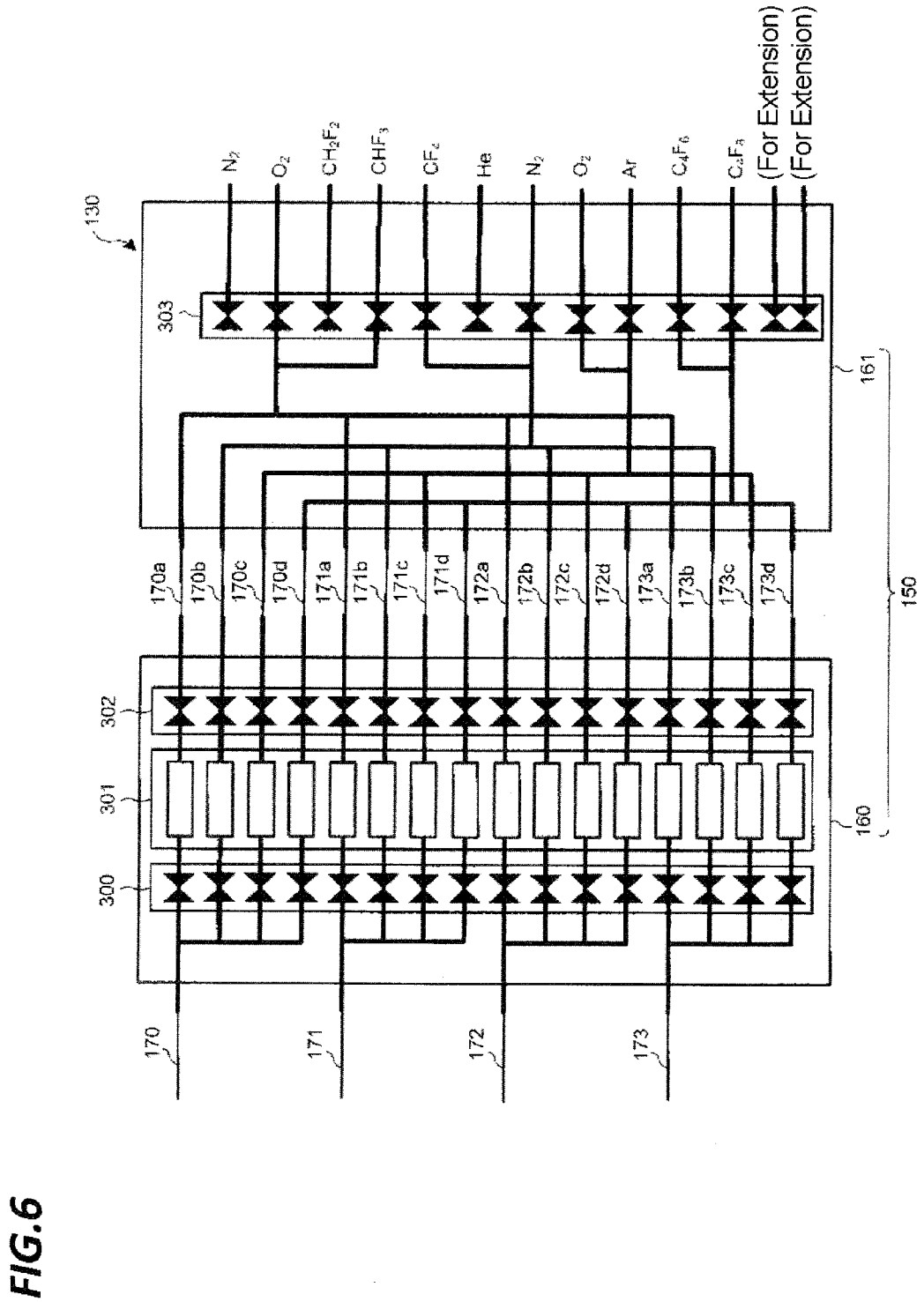
FIG. 6 is a view illustrating a configuration of a gas supply device in the plasma etching device according to the exemplary embodiment.

Next, the gas supplying device 150 and a gas supplying system configured to separately supply the etching gas to each of the areas 143a to 143d of the buffer chamber 143 will be described with reference to FIG. 6. The gas supplying device 150 includes a first gas box 161 and a second gas box 160. The first gas box 161 accommodates a first collecting valve 303 which is connected to a plurality of gas supplying sources (not illustrated) and the second gas box 160 accommodates a second collecting valve 302, flow controllers 301 such as mass flow controllers which are provided to correspond to the valves of the second collecting valve 302, respectively, and a third collecting valve 300.

In the present exemplary embodiment, a gas such as $CF_4$, $C_4F_6$, $C_4F_8$, $CH_2F_2$, or $CHF_3$ as a fluorocarbon based fluoric compound (CF based) is sealed in the gas supplying source. Similarly, oxygen ($O_2$) gas is sealed as a gas which controls the attachment of a CF based reaction product. Further, a rare gas such as Ar or He or $N_2$ gas is sealed as a carrier gas.

A pipe from each gas supplying source is connected to a corresponding valve in the first collecting valve 303 in the first gas box 161. Further, in the present exemplary embodiment, a $CHF_3$ gas pipe and an $O_2$ gas pipe are joined to each other and branched into four branch pipes 170a, 171a, 172a, and 173a at the downstream side of the first collecting valve 303. The first collecting valve 303 is controlled in such a manner that any of $CHF_3$ gas and $O_2$ gas flows in the branch pipes 170a to 173a.

Similarly, a $CF_4$ gas pipe and a $N_2$ gas pipe are joined to each other and branched into four branch pipes 170b, 171b, 172b, and 173b at the downstream side of the first collecting valve 303. The first collecting valve 303 is controlled in such a manner that any of $CF_4$ gas and $N_2$ gas flows in the branch pipes 170b to 173b.

Similarly, an $O_2$ gas pipe and an Ar gas pipe are joined to each other and branched into four branch pipes 170c, 171c, 172c, and 173c at the downstream side of the first collecting valve 303. The first collecting valve 303 is controlled in such a manner that any of $O_2$ gas and Ar gas flows in the branch pipes 170c to 173c.

A $C_4F_6$ gas pipe and a $C_4F_8$ gas pipe are joined to each other and branched into four branch pipes 170d, 171d, 172d, and 173d at the downstream side of the first collecting valve 303.

The first collecting valve 303 is controlled in such a manner that any of $C_4F_6$ gas and $C_4F_8$ gas flows in the branch pipes 170d to 173d.

The branch pipes 170a to 173a, 170b to 173b, 170c to 173c, and 170d to 173d are connected to corresponding valves in the second collecting valve 302 in the second gas box 160, respectively, and also connected to the corresponding valves of the third collecting valve 300 through the corresponding flow controllers 301, respectively.

Pipes corresponding to the branch pipes 170a, 170b, 170c, and 170d are joined to the pipe 170 at the downstream side of the third collecting valve 300 and the pipe 170 communicates with the central area 143a of the shower head 140 (see FIG. 5B). Further, pipes corresponding to the branch pipes 171a, 171b, 171c, and 171d are joined to the pipe 171 at the downstream side of the third collecting valve 300 and the pipe 171 communicates with the middle area 143b of the shower head 140 (see FIG. 5B). Similarly, pipes corresponding to the branch pipes 172a, 172b, 172c, and 172d are joined to the pipe 172 at the downstream side of the third collecting valve 300 and the pipe 172 communicates with the peripheral edge area 143c of the shower head 140 (see FIG. 5B). Further, pipes corresponding to the branch pipes 173a, 173b, 173c, and 173d are joined to the pipe 173 at the downstream side of the third collecting valve 300 and the pipe 173 communicates with the outermost peripheral edge area 143d of the shower head 140 (see FIG. 5B).

With the above configuration, the third collecting valve 300, the second collecting valve 302, and the first collecting valve 303 are appropriately opened or closed so that each etching gas may be selectively supplied to each the areas 143a to 143d of the shower head 140. That is, in the example of FIG. 6, each of the pipes connected to the gas supplying sources is branched into four pipes, like the pipes 170 to 173. Further, the pipes are connected to the first collecting valve 303 and configured to be capable of switching the gas species in accordance with a desired process. With this configuration, addition of a new gas supplying source or stopping of supplying an etching gas which is not required by a process may be conducted through simple manipulation.

As described above, the plasma etching device 100 includes the device controller 190. The device controller 190 includes an arithmetic processing device (not illustrated) which includes a CPU and a recording medium (not illustrated) which includes a hard disk. The device controller 190 controls an operation of each component of the first radio frequency power source 114, the second radio frequency power source 116, the temperature distribution adjusting unit 106, the upper electrode driving unit 200 and a gas supplying condition adjusting unit 130 which have been described above. When operating each component, the CPU of the device controller 190 controls the component according to a program recorded in the hard disk of the device controller 190 and corresponding to each etching processing.

(Operation of Manufacturing Device according to Exemplary Embodiment)

Figure 7:
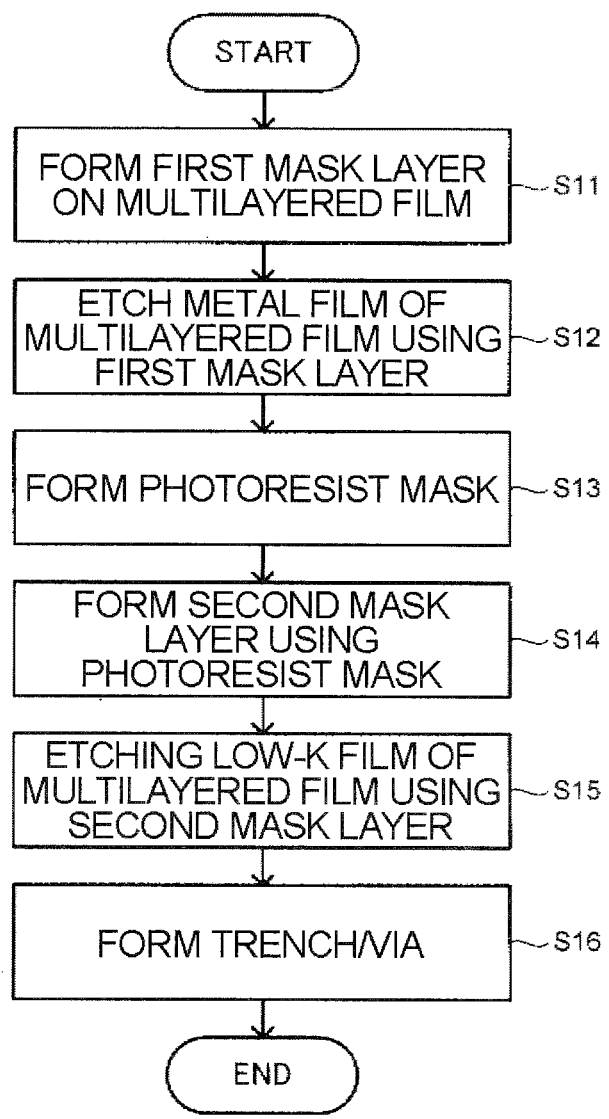
FIG. 7 is a flowchart illustrating an example of a plasma etching method by the plasma etching device according to the exemplary embodiment.

Next, operations of a manufacturing device according to an exemplary embodiment which is performed using a plasma etching device 100 will be described with reference to FIGS. 4 to 8D. FIG. 7 is a flowchart illustrating a process of a semiconductor device manufacturing method according to an exemplary embodiment, and FIGS. 8A to 8D are views illustrating states of a wafer W in respective processes. For the convenience, FIGS. 8A to 8D illustrate one of a plurality of trench/via structures which are formed on a wafer. Further, the processes illustrated in FIGS. 8A to 8D are continuously performed in the plasma etching device 100.

Figure 8A:
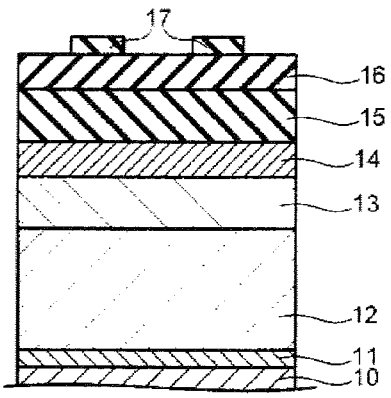
FIG. 8A is a view illustrating a state in the vicinity of a surface of a wafer W when the plasma etching method illustrated in FIG. 7 is performed.

First, as illustrated in FIG. 8A, a block layer 11, a low dielectric (low-k) layer 12, a silicon oxide film 13, a titanium nitride (TiN) layer 14, an organic planarization layer 15, an anti-reflection film 16, and a first mask layer 17 are formed on a wiring layer 10 formed on a wafer in this order as a multi-layered film (step S11 of FIG. 7, hereinafter, referred to as "S11").

The block layer 11 is formed of a material such as, for example, silicon oxide, using a plasma CVD method. The block layer 11 is formed between the wiring layer 10 and the low-k film 12 to reduce the degradation of the wiring layer 10 caused by the low-k film 12 so as to protect the wiring layer 10.

The low-k film 12 is formed by a low dielectric material having a low dielectric constant of about 3.5 or less. The low-k film 12 may be formed of, for example, Black Diamond (registered trade mark), silicon oxide to which an impurity such as SiOF or SiOC is added, or a porous material. Further, the low-k film 12 may be formed of a spin-on material having hydrogen silsesquioxane (HSQ) or methylsilsesquioxane (MSQ) as a main component. In the present exemplary embodiment, the low-k film 12 is formed of Black Diamond.

The silicon oxide film 13 may be formed by an oxygen plasma CVD method using tetraethoxysilane (TEOS) as a raw material. The organic planarization layer 15 is appropriately performed by a spin-on material having an organic material as a main component. According to this, an unevenness of a base layer is alleviated by the flowability of the spin-on material so that the organic planarization layer 15 having a flat top surface is obtained.

The anti-reflection film 16 and a photoresist film (not illustrated) are sequentially formed on the top surface of the organic planarization layer 15 and the photoresist film is patterned by a photolithographic technology so that first mask layers 17 are obtained. The first mask layers 17 have a line type pattern which extends in one direction. A pattern of the first mask layer 17 is determined in accordance with a pattern of a trench (i.e., an upper layer wiring to be formed later) which will be described below.

Subsequently, a wafer W having a structure illustrated in FIG. 8A is carried into a chamber 102 of the plasma etching device 100. The anti-reflection film 16 and the organic planarization layer 15 are removed using the first mask layers 17. The removal is performed by exposing the wafer to the oxygen plasma. Next, when the TiN layer 14 is etched using plasma etching, the pattern of the first mask layers 17 is transferred to the TiN layer 14. Next, when the first mask layers 17 used for the etching and the anti-reflection film 16 and the organic planarization layer 15 remaining below the first mask layers 17 are removed by the oxygen plasma, metal hard masks (MHMs) 14a is obtained (S12 of FIG. 7).

Next, an organic planarization layer 25 is formed to cover the MHM 14a and the silicon oxide film 13 which is a base layer thereof. The organic planarization layer 25 may be formed of the same material and by the same method as the organic planarization layer 15. Next, an anti-reflection film 26 and a photoresist film are formed on the organic planarization layer 25 and the photoresist film is patterned so that a photoresist mask 27 is formed (S13 of FIG. 7). The photoresist mask 27 has an opening 27h whose top side shape is substantially rectangular and width is narrower than an interval (an interval of MHMs 14a) of the first mask layers 17. Further, the opening 27h is formed at a position where a via electrically connected with the wiring layer 10 is to be formed and the width of the opening 27h corresponds to the size of the via.

Figure 8D:
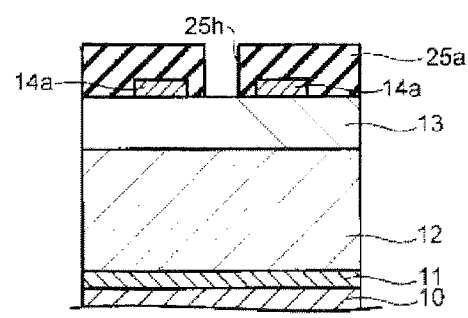
FIG. 8D is a view illustrating a state in the vicinity of the surface of the wafer W when the plasma etching method illustrated in FIG. 7 is performed.
Figure 8B:
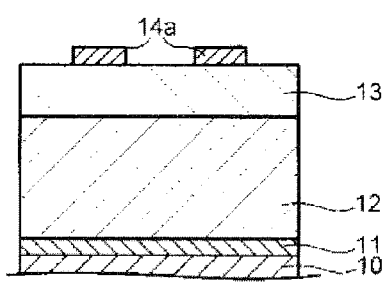
FIG. 8B is a view illustrating a state in the vicinity of the surface of the wafer W when the plasma etching method illustrated in FIG. 7 is performed.

Next, the anti-reflection film 26 and the organic planarization layer 25 are etched using the photoresist mask 27 as a mask and as illustrated in FIG. 8D, a second mask layer 25a is formed from the organic planarization layer 25 (S14 of FIG. 7). The second mask layer 25a has an opening 25h having the same size as the opening 27h of the photoresist mask 27.

Figure 8E:
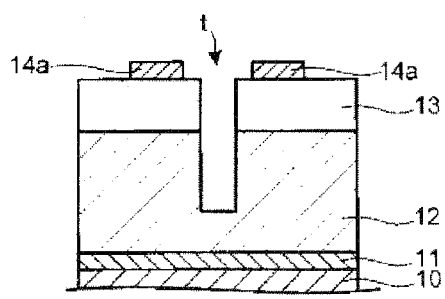
FIG. 8E is a view illustrating a state in the vicinity of the surface of the wafer W when the plasma etching method illustrated in FIG. 7 is performed.
Figure 8C:
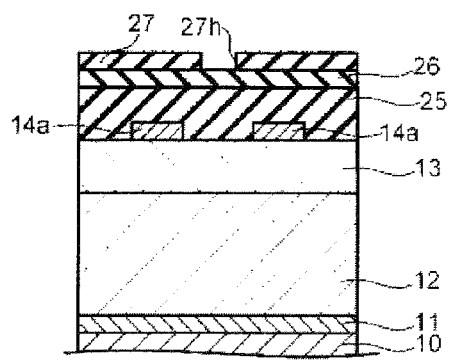
FIG. 8C is a view illustrating a state in the vicinity of the surface of the wafer W when the plasma etching method illustrated in FIG. 7 is performed.

Next, when the silicon oxide film 13 and the low-k film 12 are subjected to plasma etching by a $C_4F_8/Ar/N_2/O_2$ mixture gas using the second mask layer 25a and the second mask layer 25a used for the plasma etching is removed, a structure illustrated in FIG. 8E is obtained (S15 of FIG. 7). In this structure, a hole t which passes through the silicon oxide film 13 and has a depth which is smaller than the total thicknesses of the silicon oxide film 13 and the low-k film 12 is formed. Further, the depth of the hole t is determined by an etching time.

Figure 8F:
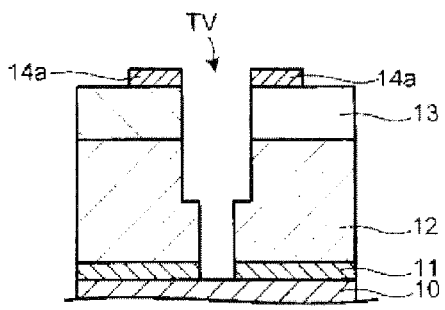
FIG. 8F is a view illustrating a state in the vicinity of the surface of the wafer W when the plasma etching method illustrated in FIG. 7 is performed.

Next, when the silicon oxide film 13 and the low-k film 12 are subjected to plasma etching again by a $CHF_3/Ar/N_2$ mixture gas using the MHM 14a as a mask, a structure illustrated in FIG. 8F is obtained (S16 of FIG. 7). Specifically, the plasma etching is performed from a portion (see FIG. 8E) of the silicon oxide film 13 which is not covered by the MHM 14a, and a trench T which reaches a predetermined depth position of the low-k film 12 through the silicon oxide film 13 is formed. In the meantime, the bottom of the hole t illustrated in FIG. 8E is also subjected to plasma etching and a via V is formed in which the top surface of the wiring layer 10 is formed as the bottom surface of the via V. Therefore, a trench/via TV is formed. In an illustrated example, the trench T has a width of the first mask layer 17 and extends in a direction perpendicular to the width and the via V is formed as an opening having a substantially columnar shape at a predetermined position of the bottom of the trench T.

Next, a metal is filled in the via V and the trench T through a damascene process such that a via plug electrically connected to the wiring layer 10 and a metal wiring integrally connected to the via are formed.

Specific Example

Figure 9A:
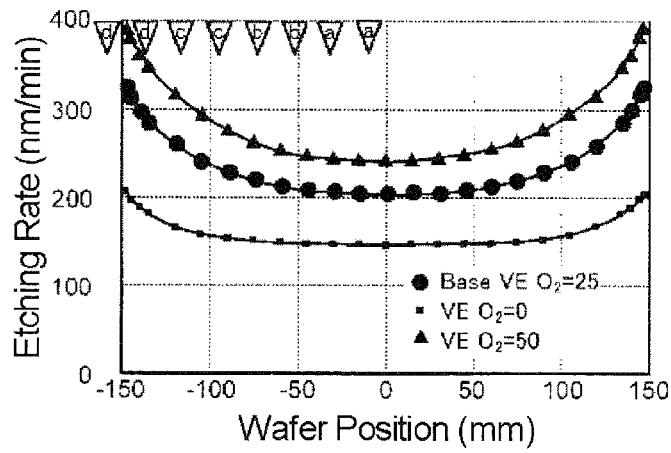
FIG. 9A is a view illustrating in-plane uniformity of an etching rate when a flow rate of $O_2$ is changed at a central portion and a peripheral edge portion of a wafer in a plasma etching method according to an exemplary embodiment.
Figure 9B:
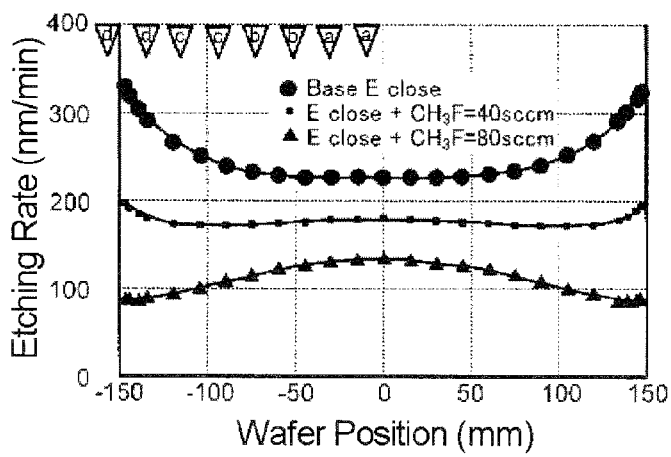
FIG. 9B is a view illustrating in-plane uniformity of an etching rate when $CH_3F$ is supplied to a peripheral edge portion of the wafer as processing gas in a plasma etching method according to an exemplary embodiment.
Figure 9C:
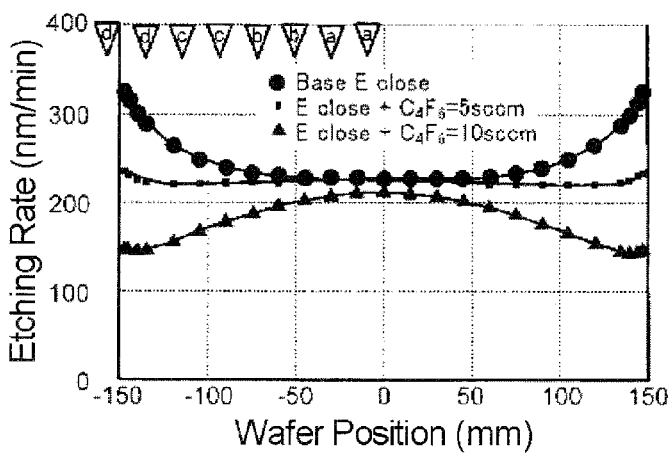
FIG. 9C is a view illustrating in-plane uniformity of an etching rate when $C_4F_6$ is supplied to a peripheral edge portion of a wafer in a plasma etching method according to an exemplary embodiment.

Wafer in-plane etching rates were researched in connection with a case in which an oxygen flow rate at a peripheral edge portion of a wafer is changed, a case in which $CH_3F$ gas is introduced into a peripheral edge portion of a wafer, and a case in which $C_4F_6$ gas is introduced into a peripheral edge portion of a wafer, using the plasma etching device illustrated in FIG. 4. FIG. 9A illustrates etching rates when oxygen flow rates at the peripheral edge portions of wafers are changed, FIG. 9B illustrates etching rates when $CH_3F$ gas is introduced into the peripheral edge portions of wafers, and FIG. 9C illustrates etching rates when $C_4F_6$ gas is introduced into the peripheral edge portions of wafers.

As illustrated in FIG. 9A, when the $O_2$ gas introduced into the peripheral edge portion of a wafer was zero, the sudden increase of the etching rate at the peripheral edge portion of the wafer still remains. Further, as illustrated in FIG. 9B, when the $CH_3F$ gas was introduced into the wafer peripheral edge portion, relatively good in-plane uniformity was obtained when the flow rate is 40 sccm. However, the etching rate over the wafer was lowered and the sudden increase of the etching rate at the wafer peripheral edge portion remains slightly. Further, as illustrated in FIG. 9C, when the $C_4F_6$ gas was introduced into the wafer peripheral edge portion, a satisfactory in-plane uniformity was obtained when a flow rate was 5 sccm.

It is believed that the results of the $CH_3F$ gas and the $C_4F_6$ gas are different from each other due to the difference of chemical bonds. That is, $C_4F_6$ is unsaturated (having double bonds of C=C), and, thus has a structure that may scavenges oxygen radicals more easily. That is, it is believed that a gas containing carbons of an unsaturated structure such as $C_xH_yF_z$, $C_xF_y$, or $C_xH_y$ (x, y, and z are natural numbers, the same hereinafter) is appropriate.

In addition, in terms of the $CH_3F$ gas and the $C_4F_6$ gas, it is believed that, since the former has a smaller molecular weight and the introduced flow rate of the former becomes higher, the former is more easily spread widely over the wafer as compared with the $C_4F_6$. That is, it is desirable to select a processing gas which has a large molecular weight and, thus, hardly spreads.

Modified Embodiment 1 of Plasma Etching Device

Next, a modified embodiment of the plasma etching device according to the exemplary embodiment will be described. In this modified embodiment, a configuration in the vicinity of the shower head of the plasma etching device illustrated in FIG. 4 is changed. In the following description, the same components as those of the plasma etching device illustrated in FIG. 4 will be denoted by the same reference numerals and overlapping descriptions will be omitted.

Figure 10A:
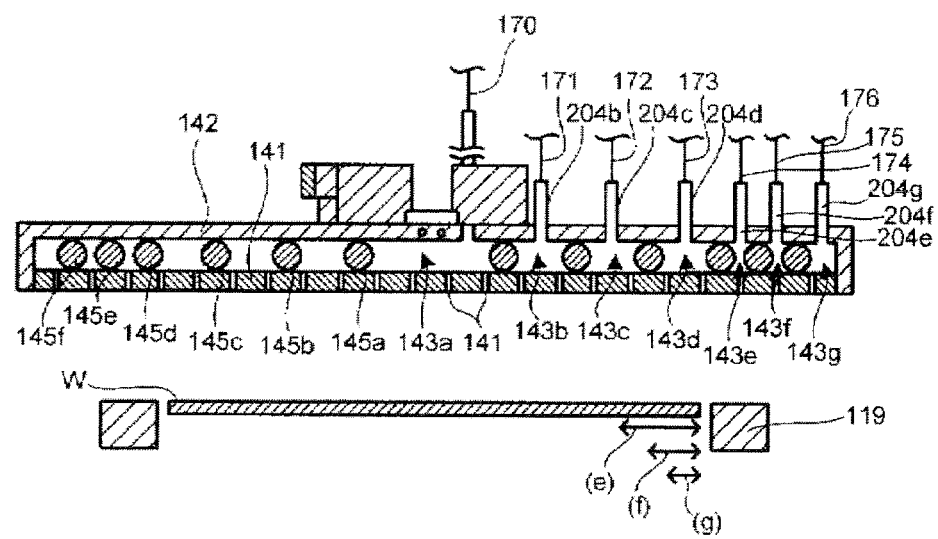
FIG. 10A is a view illustrating a modified embodiment of a plasma etching device according to an exemplary embodiment.

As illustrated in FIG. 10A, in a plasma etching device according to the modified embodiment, the shower head 140 (upper electrode 120) of the plasma etching device illustrated in FIG. 4 is provided to extend beyond the outer circumference of the focus ring 119 to the outside and buffer chambers 143e to 143g are provided in addition to the buffer chambers 143a to 143d. Pipes 174 to 176 are connected to the buffer chambers 143e to 143g, respectively. The pipes 174 to 176 are connected to a gas supplying device (not illustrated) and also allow gases of various flow rate/gas species to be supplied, similarly to the pipes 170 to 173.

Figure 10B:
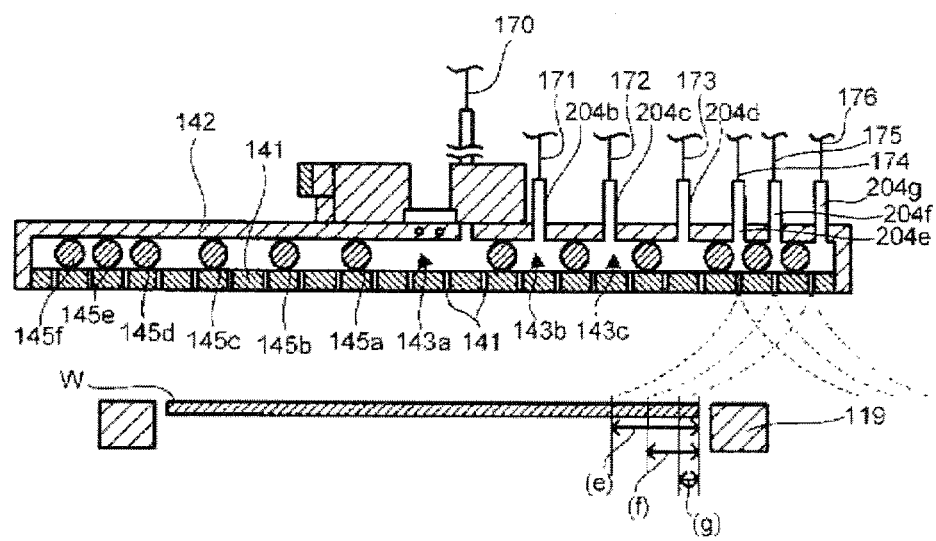
FIG. 10B is a view illustrating a modified embodiment of a plasma etching device according to an exemplary embodiment.
Figure 11:
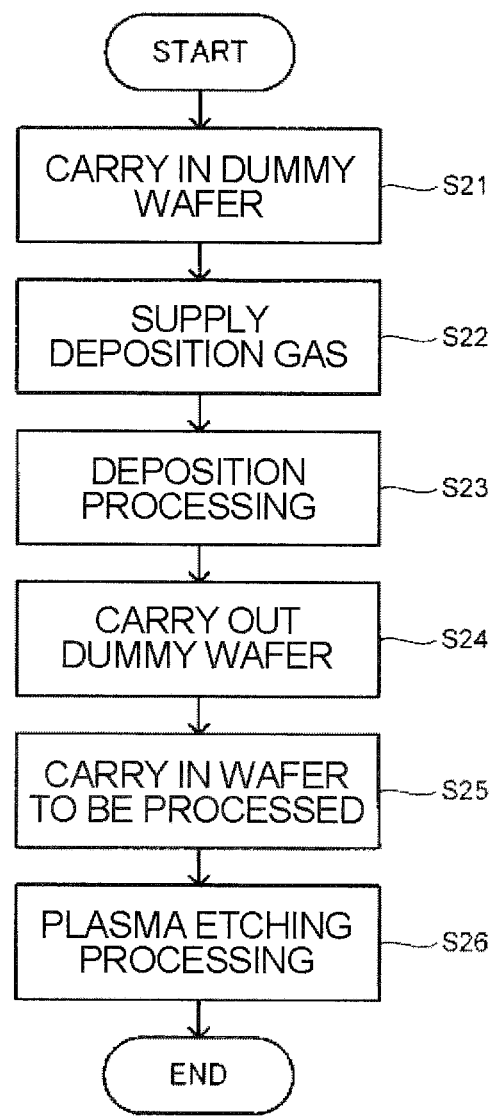
FIG. 11 is a flowchart illustrating a modified embodiment of a semiconductor device manufacturing method according to an exemplary embodiment.

That is, as illustrated in FIG. 10B, the processing gas which has passed through the buffer chambers 143e to 143g is adapted to reach the areas e to g in the peripheral edge area of the wafer W so that the etching rate at the peripheral edge portion of the wafer W may be controlled. According to the plasma etching device of to the present modified embodiment, the etching rate may be uniformized from the central portion to the peripheral edge portion of the wafer and the etched shapes may also be uniformized. Here, the etched shape may be any of an etching rate, in-plane uniformity, and bowing which may be used to determine the quality of a device processing.

Modified Embodiment of Etching Method

Next, a modified embodiment of the plasma etching method according to the exemplary embodiment will be described. In the present modified embodiment, prior to plasma etching, a dummy wafer is carried in and a deposition processing is performed on a focus ring in advance.

First, the device controller 190 opens the gate valve 132, carries a dummy wafer into the chamber 102, and dispose the dummy wafer on the electrostatic chuck 111 (S21). After the dummy wafer is carried in, the gate valve 132 is closed and decompression is preformed by the exhausting device 135.

Next, the gas supplying device 150 introduces a deposition gas (sedimentary gas) such as, for example, $C_xH_yF$, or $C_xF_y$, $C_xH_y$, into the chamber 102 (S22). The device controller 190 controls the first radio frequency power source 114 or the second radio frequency power source 116 to generate plasma in the chamber 102 so as to perform a deposition processing (S23). In this case, the gas supplying device 150 may supply the deposition gas only to the buffer chamber 143d and the deposition processing may be intensively performed on the peripheral edge portion of the wafer W. A deposition material is deposited on the focus ring 119 by the deposition processing.

Next, the dummy wafer is carried out through the gate valve 132 (S24) and a wafer W to be processed is disposed on the electrostatic chuck 111 (S25). After the wafer W to be processed is carried in, the gate valve 132 is closed and decompression is performed by the exhausting device 135. Next, a predetermined plasma etching process is performed (S26).

According to the present modified embodiment, prior to the plasma etching, since the deposition processing is performed on the focus ring 119 using the deposition gas such as $C_xH_yF_z$, or $C_xF_y$, or $C_xH_y$, surplus O radicals on the focus ring may be removed in the plasma etching process.

Modified Embodiment 2 of Plasma Etching Device

Next, a modified embodiment of the plasma etching device according to the embodiment will be described. In the present modified embodiment, a configuration in the vicinity of the shower head and a configuration in the vicinity of the focus ring of the plasma etching device illustrated in FIG. 4 are modified. In the following description, the same components as those of the plasma etching device illustrated in FIG. 4 are denoted by the same reference numerals and overlapping descriptions will be omitted.

Figure 12A:
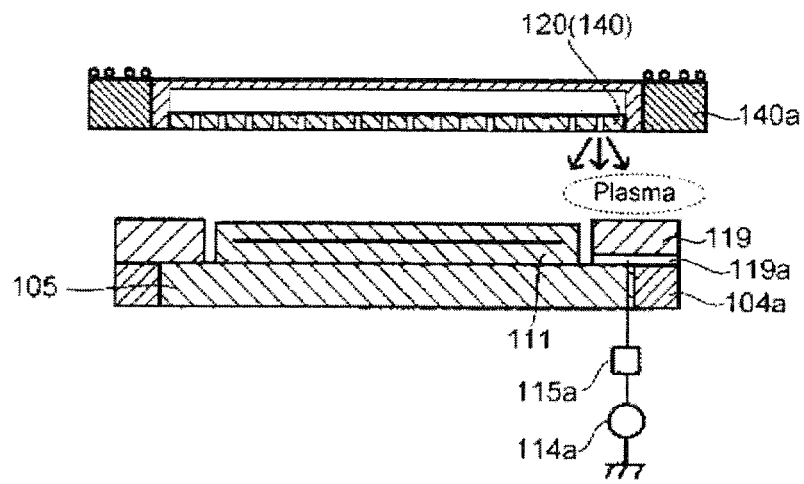
FIG. 12A is a view illustrating a modified embodiment of a plasma etching device according to an exemplary embodiment.

As illustrated in FIG. 12A, the plasma etching device according to the modified embodiment includes a support 104a which adjusts the temperature of the focus ring 119 of the plasma etching device illustrated in FIG. 4, an electrostatic electrode 119a which generates plasma above the focus ring 119, a radio frequency power source 114a, a matching unit 115a, and an inductively coupled plasma device (ICP device) 140a which is provided at an outer peripheral portion of the shower head 140. That is, in the present modified embodiment, a mechanism configured to generate the plasma above the focus ring 119 is added to the plasma etching device illustrated in FIG. 4.

Figure 12B:
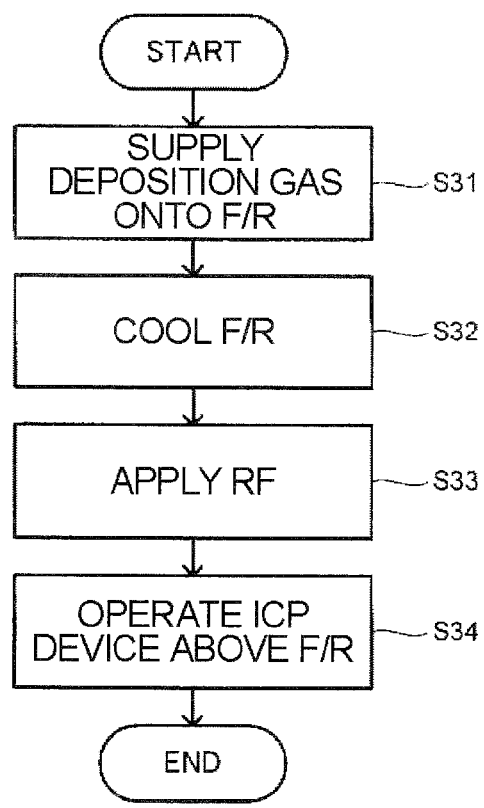
FIG. 12B is a flowchart illustrating an example of a method of manufacturing a semiconductor device by a plasma etching device illustrated in FIG. 12A.

Next, the operation of the plasma etching device according to the present modified embodiment will be described with reference to FIG. 12B. After a wafer to be processed is carried onto the electrostatic chuck 111, the gas supplying device 150 introduces a deposition gas such as $C_xH_yF_z$, $C_xF_y$, or $C_xH_y$ into the peripheral edge portion of the wafer (or on the focus ring) (S31). Further, the support 104a lowers the temperature of the focus ring 119 and increases a radical adsorption rate on the focus ring 119 (S32).

Next, the device controller 190 connects the radio frequency power source 114a to the electrostatic electrode 119 to apply a radio frequency voltage and generate plasma (S33). The plasma on the focus ring 119 may be generated using the radio frequency voltage applied by the radio frequency power source 114a, using an ICP device 140a, or using both the radio frequency power source 114a and the ICP device 140a. Further, the same effects may also be obtained when the focus ring is cooled in the conventional plasma etching, rather than generating the plasma on the focus ring 119.

According to the present modified embodiment, since the plasma is generated on the focus ring using the deposition gas to perform the deposition processing, surplus O radicals may be removed from the focus ring in the plasma etching processing.

Although the exemplary embodiments of the present disclosure have been described above, the present disclosure is not limited to the specific embodiments and various modifications or changes may be made within the scope of the present disclosure described in the following claims. For example, a workpiece capable of being etched in the plasma etching device 100 according to the exemplary embodiments of the present disclosure is not particularly limited. For example, as a wafer including a silicon substrate, a wafer which is formed with a silicon dioxide ($SiO_2$) film, a film to be etched including a polysilicon film, a mask layer formed in a single layer or multiple layers, an anti-reflection film (bottom anti-reflective coating (BARC)), and a photoresist film thereon may be used.

REFERENCE NUMERALS

W: Wafer
105: Susceptor (support unit)
106: Temperature distribution adjusting unit
120: Upper electrode (electrode)
122: Bellows
130: Gas supplying condition adjusting unit
140: Shower head
143: Buffer chamber
145: Annular partitioning member
150: Gas supplying device
190: Device controller
200: Upper electrode driving unit

The invention claimed is:

1. A method of manufacturing a semiconductor device including a wafer using a plasma etching device which includes a chamber, a chuck provided in the chamber to dispose the wafer to be processed thereon, a focus ring disposed at a peripheral edge portion of the chuck to surround the wafer disposed on the chuck, and a gas supplying mechanism configured to separately supply various types of gases, the method comprising:

providing a shower head having a plurality of regions including a central region and a peripheral edge region surrounding the central region, each region configured to selectively supply one of the various types of gases from the gas supplying mechanism to each of a plurality of regions of the wafer along a radial direction of the wafer;

placing a wafer covered with an organic film on the chuck;

introducing, from the gas supplying mechanism through the central region of the shower head to a central portion of the wafer, an etching gas which includes at least $O_2$ gas and etches the organic film on the wafer;

introducing, from the gas supply mechanism through the peripheral edge region of the shower head to a peripheral edge portion of the wafer, an etching inhibiting factor gas having a property of reacting with O radicals which do not react with the organic film and exists on the focus ring when a plasma etching is performed; and performing the plasma etching on the wafer using the etching gas by generating plasma with the etching gas while eliminating the O radicals and thereby suppressing etching in the peripheral edge portion of the wafer, wherein the etching inhibitor gas includes at least a CxFy gas.

2. The method of claim 1, wherein the etching inhibiting factor gas is formed of a gas which includes at least one of $CF_4$, $C_4F_6$, and $C_4F_8$.

3. The method of claim 1, wherein the etching inhibiting factor gas is formed of a gas which includes at least a $C_4F_6$ gas.

4. The method of claim 1, wherein the etching inhibiting factor gas is formed of a mixture gas which includes an unsaturated gas.

5. The method of manufacturing a semiconductor device of claim 1, wherein each of the plurality of regions of the shower head is separated by an O ring.

* * * * *